US006560306B1

(12) United States Patent
Duffy et al.

(10) Patent No.: US 6,560,306 B1
(45) Date of Patent: *May 6, 2003

(54) PHASE LOCKED LOOP (PLL) WITH LINEAR PARALLEL SAMPLING PHASE DETECTOR

(75) Inventors: Michael L. Duffy, Austin, TX (US); Mohammad J. Navabi, Austin, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/465,565

(22) Filed: Dec. 17, 1999

Related U.S. Application Data

(63) Continuation of application No. 08/878,714, filed on Jun. 19, 1997, now Pat. No. 6,026,134.

(51) Int. Cl.[7] ................................................ H03D 3/24

(52) U.S. Cl. ...................... 375/376; 375/374; 375/375; 327/147; 327/148

(58) Field of Search .............................. 375/376, 354, 375/374, 375, 326, 327, 373; 331/1 A, 11; 327/242, 12, 147, 148, 156, 157, 236; 381/15

(56) References Cited

U.S. PATENT DOCUMENTS

| 4,378,509 A | | 3/1983 | Hatchett ...................... 307/528 |
| 4,535,459 A | | 8/1985 | Hogge, Jr. .................... 375/80 |
| 4,541,109 A | * | 9/1985 | Shimizu et al. ................ 381/15 |
| 4,773,085 A | * | 9/1988 | Cordell ........................ 375/375 |
| 4,888,564 A | * | 12/1989 | Ishigaki ...................... 331/1 A |

(List continued on next page.)

OTHER PUBLICATIONS

"A 0.8μm CMOS 2.5G/s Oversampled Receiver for Serial Links"; Chih–Kong Ken Yang, Mark A. Horowitz; Feb. 9, 1996; 200–201, 158–159, 410.

"A 1.0625Gbps Transceiver with 2x–Oversampling and Transmit Signal Pre–Emphasis"; Alan Fiedler et al., Feb. 7, 1997; 238–239, 186–187, 420.

(List continued on next page.)

Primary Examiner—Shuwang Liu
(74) Attorney, Agent, or Firm—Christopher P. Maiorana, P.C.

(57) ABSTRACT

A parallel sampling phase detector with linear output response. The parallel sampling phase detector for use in data recovery. The device includes a voltage controlled oscillator (VCO) that generates ten separate phase signals using a five stage ring oscillator. Five linear phase detectors are employed in the device, each operating during one of five "window" intervals. The "window" intervals are non-overlapping, and are generated using preselected ones of the VCO output phases. The linear phase detectors each generate, respectively, a variable pulsewidth pump up signal wherein the pulsewidth of the pump up signal is proportional to a phase difference between the input data signal applied to the phase detector, and the output phase signals of the VCO. Each phase detector also generates a pump down signal that has a fixed pulsewidth. A loop filter determines the difference between the pump up and pump down signals and develops a control signal to vary the output frequency and phase of the VCO in accordance therewith. Each phase detector also operates as a deserializer, capturing, during the interval when the respective "window" signal is active, the data signal from the input data stream. The plurality of sampled data signals are captured by a data register, which then outputs an n-bit (5-bit) parallel format data word. The linear phase detector includes means for generating the pump down signal in response to the generation of the pump up signal.

22 Claims, 3 Drawing Sheets

U.S. PATENT DOCUMENTS

| | | | | |
|---|---|---|---|---|
| 5,485,484 A | * | 1/1996 | Williams et al. | 375/376 |
| 5,548,251 A | | 8/1996 | Chou et al. | 331/57 |
| 5,550,515 A | * | 8/1996 | Liang et al. | 331/11 |
| 5,570,053 A | * | 10/1996 | Takla | 327/292 |
| 5,633,899 A | | 5/1997 | Fiedler et al. | 375/376 |
| 5,640,523 A | * | 6/1997 | Williams | 375/360 |
| 5,652,531 A | | 7/1997 | Co et al. | 327/12 |
| 5,663,665 A | | 9/1997 | Wang et al. | 327/3 |
| 5,663,688 A | | 9/1997 | Delmas et al. | 331/14 |
| 5,731,723 A | | 3/1998 | Chen | 327/157 |
| 5,754,080 A | | 5/1998 | Chen et al. | 331/25 |
| 6,026,134 A | * | 2/2000 | Duffy et al. | 375/376 |

OTHER PUBLICATIONS

"1.25Gb/s, 460mW CMOS Transceiver for Serial Data Communication"; Dao–Long Chen et al., Feb. 7, 1997; 242–243, 190–191, 422.

"A 0.8–$\mu$m CMOS 2.5 Gb/s Oversampling Receiver and Transmitter for Serial Links"; Chih–Kong Ken Yang et al.; Dec. 1996; 2015–2023.

* cited by examiner

PHASE LOCKED LOOP (PLL) WITH LINEAR PARALLEL SAMPLING PHASE DETECTOR

This is a continuation of U.S. Ser. No. 08/878,714, filed Jun. 19, 1997, now U.S. Pat. No. 6,026,134.

The present application may relate to co-pending U.S. Pat. No. 5,926,041, issued Jul. 20, 1999, which is each hereby incorporated by reference in its entirety.

BACKGROUND OF THE INVENTION

1. Technical Field

The present invention relates to phase detection circuitry, and, more particularly, to a parallel sampling phase detector with linear output response for use, for example, in data recovery applications.

2. Discussion of the Related Art

There has been much investigation in the area of high bit rate transmitting/receiving circuitry, owing in no small part to the demand for increased bandwidth by the communications industry. In response, organizations such as the IEEE have proposed serial data communications standards with data rates in the Gigabit per second range. To eliminate the need for a separate conductor or optical fiber link carrying a companion clock signal, the above-noted serial communications standards generally call for the timing or clock information to be embedded in the data transmission itself. To insure proper transmission of timing information, it is conventional to require, in the data bitstream, a minimum number of transitions per unit time. To this end, various encoding schemes have been developed (e.g., 8B10B, which defines a 10-bit data word), that transmit a sufficient number of transitions to insure recovery of timing at the far end.

With this background, it has been conventional practice for high speed data recovery systems to use a high frequency voltage-controlled oscillator (VCO) having a frequency substantially equal to the transmission bit rate (line bit rate). Conventional phase detectors, charge pump/loop filters, and VCOs are used to extract the embedded clock from the incoming data stream, and generate a "clean" clock signal operating at the incoming data bit rate. The "clean" clock is used to synchronize the sampling of the incoming data. The sampled data, which is recovered, conventionally, in a serial fashion (i.e., just like the incoming data stream), is then converted using a serial-to-parallel conversion circuit to produce an n-bit data word.

A problem with the foregoing approach, especially as the incoming data bit rate increases into the high frequency (e.g., greater than 1 Gigabit per second range) is that such a system requires a very high frequency VCO (producing a clock signal operating at the line bit rate), and an extremely fast phase detector. This results in relatively high power consumption. In some cases, the called-for bit rate is so high that it may be impractical to generate at all using some (e.g., standard CMOS) semiconductor processes. Moreover, to implement the serial-to-parallel conversion, fast shift registers must be used, which further increase the already relatively high power consumption.

Another approach in the art has been to use a VCO generating multiple phases, each at a frequency lower than the line bit rate, and use these VCO phases with multiple phase detectors. In this approach, fixed pulsewidth "pump up" and "pump down" control pulses are generated which, as is well known, are filtered and used to generate a control signal which varies the output frequency of the VCO. A disadvantage with this approach is that the fixed pulsewidth "pump up" and "pump down" signals result in an increased sensitivity to duty cycle distortion (i.e., a "dead zone" is caused by the fixed pulsewidths which do not provide a linear indication of the phase difference between the VCO clocks and the incoming data stream). In addition, use of the fixed pulsewidth "pump up" and "pump down" signals result in data dependent phase jitter.

Thus, there is a need to provide an improved system for phase detection and/or data recovery that minimizes one or more of the problems as described above.

SUMMARY OF THE INVENTION

The present invention provides a parallel phase detector architecture, and one advantage of that architecture is that a VCO output frequency may be reduced relative to the incoming data bit rate, which in turn reduces the power consumption. For example, according to the invention, a VCO frequency may be $f_{VCO}$=bit rate/n, where n is equal to the number of phase detector stages used in the parallel architecture.

Particularly, in one aspect of the present invention, an apparatus for detecting the phase of an input signal relative to an output signal is provided. The apparatus, in one embodiment, includes a plurality of phase detector circuits each coupled to receive the input signal. Importantly, each phase detector provides a phase difference signal proportional to a phase difference between the input signal and the output signal. The apparatus further includes means responsive to the phase difference signal for generating the output signal. In a preferred embodiment, the phase difference signal comprises "pump up" and "pump down" signals wherein one of the pump up signal and the pump down signal, for each phase detector circuit, has a variable pulsewidth to thereby provide a linear response. In the preferred embodiments, the output signal may include a plurality of phases each operating at a frequency lower than the line bit rate of the input signal. This architecture obviates the need for a single, high frequency VCO output signal. A device according to this aspect of the present invention therefore achieves low power consumption. The linear phase detectors substantially minimizes sensitivity to duty cycle distortion as well as data dependent jitter.

In another aspect of the present invention, an improved phase detector is provided which has a linear output. The phase detector may be used during one phase of a multi-phase VCO output signal, such as established by an embodiment according to the first aspect of the invention. In a preferred embodiment, the phase detector includes a D-type memory element, a function gate, and means for generating a pump down signal. The D-type memory element has an input terminal configured to receive an input signal, and an output terminal. The function gate has first and second input terminals, and an output terminal configured to generate a pump up signal. The first and second input terminals of the function gate are connected to the input and output terminals of the D-type memory element. The pulsewidth of, preferably, one of the pump up signal and the pump down signal is proportional to a phase difference between the input signal, which may be an incoming data signal, and the output signal, which may be generated from a multi-phase VCO. The pump down signal generating means is responsive to at least one of the pump up signal and the memory element output signal to generate the pump down signal.

Other objects, features and advantages of the present invention will become apparent to one skilled in the art from the following detailed description and accompanying draw-

DETAILED DESCRIPTION OF THE PREFERRED EMBODIMENTS

Before proceeding to a detailed description referenced to the drawings, an overview description of the architecture of the present invention will be set forth. The basic phase lock loop (PLL) architecture according to the present invention utilizes a multi-phase output VCO, and a plurality of linear output phase detectors operating in parallel. Each phase detector operates within a respective preselected "window" determined as a function of preselected ones of the plurality of phases of the VCO circuit (designated ($\phi 0 \ldots, \phi 2n-1$), where n is the number of phase detectors used in any particular design. Each phase of the VCO runs at a frequency that is reduced relative to the incoming data bit rate, namely $f_{VCO}$=bit rate/n. Additionally, each phase detector generates a phase difference signal, preferably a pump up pulse, that has a variable pulsewidth that is proportional to the phase difference between the incoming data (i.e., specifically the timing information embedded in the incoming data stream), and the various phases of the VCO output, which are fed back to each of the linear phase detectors. Since the need for a single, high-frequency VCO output clock operating at the data bit rate has been eliminated, low power consumption is achieved. Moreover, since each of the phase detectors provides a linear phase response, sensitivity to duty cycle distortion and data dependent jitter are substantially minimized. Finally, since each phase detector also operates as a deserializer, the need for fast shift registers to perform a conventional serial-to-parallel conversion is also eliminated, thus further decreasing power consumption.

Figure 1:
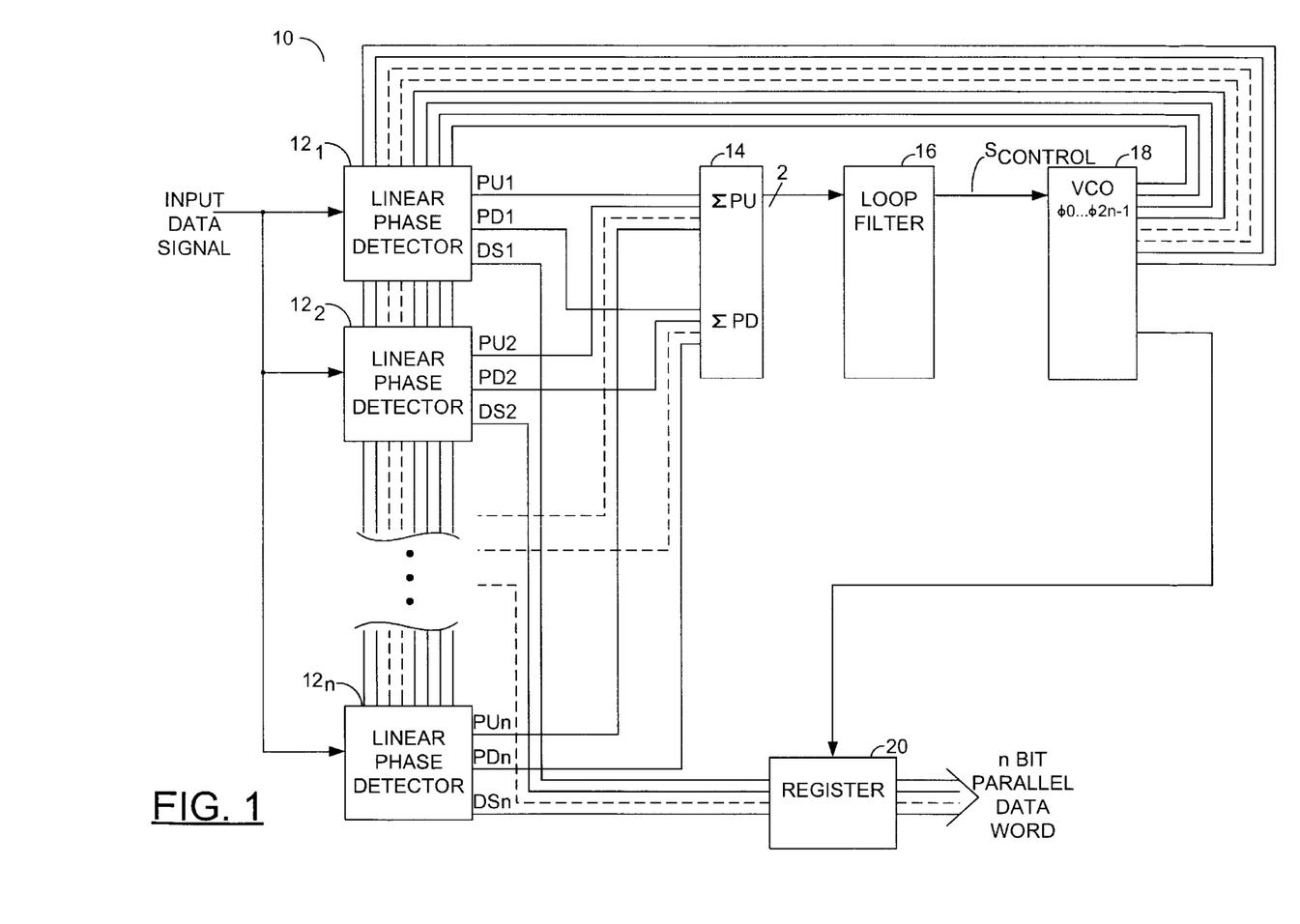
FIG. 1 is a simplified block diagram view of a parallel sampling phase detector according to the present invention.

Referring now to the drawings wherein like reference numerals are used to identify identical components in the various views, FIG. 1 shows a linear parallel sampling phase detector and deserializer apparatus 10 having a linear response in accordance with the present invention. Apparatus 10 may include a plurality of linear phase detectors and deserializers $12_1, 12_2, \ldots, 12_n$, a summing circuit 14, a loop filter circuit 16, a voltage-controlled oscillator (VCO) 18, and an n-bit data register 20.

The following detailed description of apparatus 10 will be made for a data recovery application. It should be understood, however, that the metes and bounds of the present invention are not so limited, the scope of the present invention limited only by the appended claims.

As indicated in the Background, the input data signal may have embedded therein timing information. For example, certain, standard line encoding schemes, such as 8B10B ensures a minimum transition density. Each phase detector $12_n$ generates a phase difference signal, indicated in FIG. 1 as a pump up signal PUn, and a pump down signal PDn, that together define the phase difference signal. The phase difference signal is proportional to a phase difference between the timing information represented in the input data signal, and the timing information defined by one or more of the plurality of phases of a clock signal. The clock signal is provided by VCO 18, specifically illustrated as the plurality of VCO output phases or phase signals $\phi 0, \ldots, \phi 2n-1$ of VCO 18.

The phase difference signals are summed by summing circuit 14, and the summed phase difference signals, specifically the sum of the pump-up signals, and the sum of the pump-down signals, are applied to loop filter circuit 16. Loop filter 16 develops a control signal, designated $S_{control}$, that has a magnitude indicative of the above-mentioned phase difference. The control signal $S_{control}$, as applied to VCO 18, varies the phase and frequency of the phases $\phi 0, \ldots, \phi 2n-1$ of VCO 18 so that they are substantially phase locked to the input data signal.

As mentioned above, in the preferred embodiment, each phase detector $12_1, 12_1 \ldots, 12_n$ operates according to its own control signal, preferably a "window" signal. Respective window signals (Wn—best shown in FIG. 2) are generated as a function of preselected ones of the phases of VCO 18, and is preferably active-high. In the preferred embodiment, the window signal performs one function of enabling/disabling certain other components, and may therefore also be characterized as an enable signal. Each phase detector $12, 12_2 \ldots, 12_n$ generates a respective pump-up signal during the active state of its window signal, and, further, samples data during this active state. The sampled data signals, designated DS1, DS2, ..., DSn, are captured by data register 20, which holds each one of the sampled data signals to output, collectively, an n-bit parallel data word, where n equals the number of linear phase detectors.

In a constructed embodiment, five (5) linear phase detectors are provided (i.e., n =5). Thus there are, in this embodiment, ten (10) separate phases or output signals of VCO 18, designated $\phi 0, \phi 1, \phi 2, \ldots \phi 9$ (best illustrated in FIG. 5).

The preferred embodiment, which has five linear phase detectors, is particularly suited for use in certain data communication schemes that employ ten-bit data words. However, the number of phase detectors may be varied to accommodate predetermined design objectives. For example, factors involved in selecting the number of phase detector stages include the die area consumed by the resulting design, the power savings realized by effectively reducing the frequency of the VCO output, and the complexity involved in reassembling the captured data word into the desired length data word. For example, for some applications, using only 2 phase detectors may not sufficiently lower the VCO output frequency to realize enough power savings, although this design does provide reduced die area usage (relative to the usage of a higher number of phase detectors). In addition, for n=2, there is some design complexity involved in "gluing" five (5) two-bit words together to make, for example, a ten-bit data word.

On the other hand, for n =10, the resulting apparatus may, in some applications, be deemed to consume too much die area (i.e., ten linear phase detectors $12_n$), although such an embodiment would have a fairly straightforward data word reassembly circuit, as well as reduced power savings due to a much reduced VCO output frequency of its multiple phases. To reiterate the principle behind the power savings realized by an embodiment according to the invention, the frequency of each one of the 2n phases of the VCO clock output is substantially equal to: $f_{VCO}$=bit rate/n. Thus, as n increases, the frequency of the individual phases of the VCO output decreases, thus reducing the number of transitions, and, accordingly, power consumption.

Figure 2:
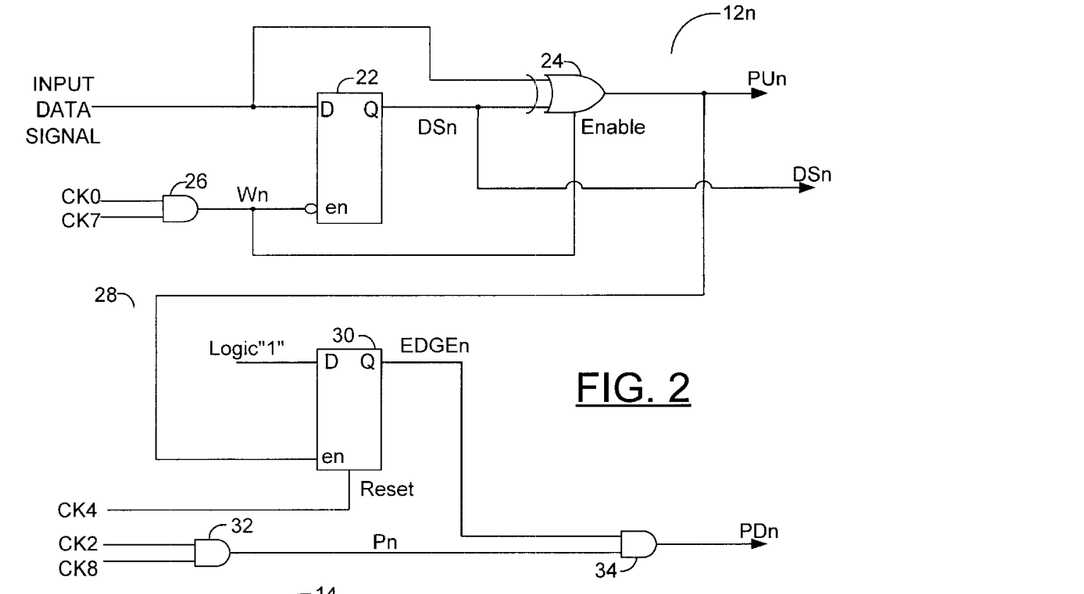
FIG. 2 is a simplified, schematic and block diagram view of a linear phase detector in accordance with another aspect of the present invention.

FIG. 2 shows a preferred implementation of one of the linear phase detectors $12_n$. Any linear output phase detector may be used to implement an embodiment of the present invention. That is, any phase detector that provides an output that is proportional to or linearly corresponds to a phase difference between the input signal, and one or more phases of a clock signal (e.g., VCO output phases) may be used. For example, such a linear phase detector is disclosed in U.S. Pat. No. 4,535,459, entitled "SIGNAL DETECTION APPARATUS" issued to Hogge, Jr., and hereby incorporated herein by reference. Preferably, however, at least one, and most preferably each one of the linear phase detectors $12_n$ comprises the circuit illustrated in FIG. 2.

Linear phase detector (LPD) $12_n$ may include a first D-type memory element 22, a function gate, such as an exclusive OR (XOR) gate 24, a first means for conjunctively joining signals, such as an AND gate 26, and means 28 for generating a pump down signal $PD_n$ which comprises a second D-type memory element 30, a second conjunctively joining means, such as a second AND gate 32, and a third conjunctively joining means, such as a third AND gate 34.

D-type memory element 22, in a preferred embodiment, is a D-type latch 22 (as illustrated in FIG. 2). It should be appreciated that latch 22 is responsive to or sensitive to the pulse duration of Window signal Wn. However, in alternate embodiments, a D-type flip flop 22' (not shown) may also be used. A D-type flip flop 22' is, as well known, sensitive to or responsive to pulse transitions (e.g., edge triggered).

In addition, function gate, particularly XOR gate 24, is illustratively shown as having an enable input terminal. A logic high on the enable terminal enables gate 24 for output; however, a logic low applied thereto causes the output to, preferably, be generated in a logic low state.

The invention, in a preferred embodiment, couples a D-type latch 22 with an XOR gate 24 having an enable/disable input. Alternatively, in another embodiment, D-type latch 22 may be coupled with an XOR gate 24 without an enable/disable input terminal. In a further alternative embodiment, a D-type flip flop 22' may be coupled to a XOR gate having a disable/enable input terminal.

Each LPD 12 is configured to receive the input data signal. In addition, each LPD 12 receives preselected phases of the VCO 18 output. For the embodiment of the invention where the number of linear phase detectors is equal to five (5), the specific VCO phase applied to the clock inputs of detector $12_i$ designated in FIG. 2 as CK0, CK7, CK4, CK2, and CK8, are set forth in Table 1 found below.

TABLE 1

Clock Routing for Five Parallel Stages

| Stage | CK0 | CK2 | CK4 | CK7 | CK8 |
|---|---|---|---|---|---|
| 1 | φ0 | φ2 | φ4 | φ7 | φ8 |
| 2 | φ2 | φ4 | φ6 | φ9 | φ0 |
| 3 | φ4 | φ6 | φ8 | φ1 | φ2 |
| 4 | φ6 | φ8 | φ0 | φ3 | φ4 |
| 5 | φ8 | φ0 | φ2 | φ5 | φ6 |

AND gate 26 may use clocks CK0 and CK7 to generate a window signal Wn. In the preferred embodiment where the circuit of FIG. 2 is used for all of the phase detectors, n window signals are generated. Each LPD $12_n$ therefore generates a respective window signal W1, W2, ..., Wn. The window signals have an inactive state, preferably a logic low level, and an active state, preferably a logic high level.

When the window signal Wn is inactive (logic "0"), the latch 22 is enabled (note the inverting enable input). Therefore, the data signal appearing on the Q-output terminal tracks the input data signal applied to the D-input data terminal. XOR gate 24, however, is disabled, having a logic low signal applied to its enable input terminal. It therefore generates a pump up signal $PU_n$ that is inactive, preferably a logic "0." Even were XOR 24 not forced low, the output of XOR 24 would nonetheless be low since both of its inputs (i.e., the D-input and the Q-output from latch 22) are permitted to track each other, and will thus be the same under most operating conditions, which generates a logic "0" output for an XOR function.

When the window signal Wn is active (logic "1"), however, latch 22 is disabled. Thus, the Q-output terminal is no longer allowed to track changes occurring in the input data signal. Specifically, the Q-output terminal maintains the logic state appearing on its D-input terminal when the window signal Wn transitioned to the active state. The window signal Wn is generated in an active state so as to begin roughly one-half bit period before the time for a transition of the input data signal, and to continue one-half bit period after such nominal data transition time. This assumes that apparatus is substantially phase locked to the incoming data. Of course, due to the random nature of data, no transition may in-fact occur in the input data signal between two adjacent bit periods. This is expected; however, VCO 18 is stable enough to maintain phase lock with the incoming data signal for a preselected period of time even without any timing information (i.e., transitions).

However, should a data transition occur (e.g., a "01" bit pattern or a "10" bit pattern), the pump up signal will be generated. Specifically, the two inputs to XOR gate 24 will differ during the active part of the window signal. Since the XOR gate 24 is enabled when the window signal is active, such occurrence will generate a pump-up signal $PU_n$ for the duration of the active state of the window signal Wn after the transition (of data). When the window signal Wn subsequently transitions to the inactive state, latch 22 will again be enabled so that the Q output can track the D input, thus terminating generation of the pump-up pulse $PU_n$.

The sampled data signal $DS_n$ is stable during the time when the window signal Wn is active, and thus may be captured by data register 20 using conventional means as a function of one of the phases of VCO 18.

To the extent that a data transition occurs at a time other than the precise middle ("eye") of the active window signal Wn, the resulting duration or pulsewidth of the pump up signal $PU_n$ will vary. Particularly, the $PU_n$ signal will be either elongated or foreshortened, relative to a one-half bit period pulsewidth. That is, when a phase difference between the input data signal and the window signal Wn is substantially zero the pulsewidth of the pump up signal $PU_n$, in the preferred embodiment, will be approximately one-half bit period. This is because the input transition occurs at substantially the precise middle of the bit period. However, if the data transition occurs earlier than expected, then the pulsewidth of the $PU_n$ signal will be elongated; conversely, if the transition in the input data signal is deferred or otherwise occurs later than expected, then the pulsewidth of the pump up signal $PU_n$ will be foreshortened.

Pump down signal generating means 28 may generate, in the preferred embodiment, a fixed pulsewidth pump down signal PDn, most preferably having a pulsewidth of one-half bit period. As mentioned above, when the phase difference between the VCO output and the timing information embedded in the input data signal is substantially zero, the pump-up signal PUn is also substantially equal to one-half bit period. As will be described in further detail below, the loop filter 16 employed in the preferred embodiment is responsive to a difference in the pulsewidth of the pump up signal relative to the pump down signal (for each phase detector $12_n$). Thus, at least one of the pump up and pump down signals may be controlled to vary according to the above-defined phase difference. This provides enough information to loop filter 16 to generate the control signal $S_{control}$. Most preferably, as shown in FIG. 2, the pump up signal PUn is varied. However, the pump down signal PDn may be varied while keeping the pump up signal PUn constant. In another alternative embodiment, both the pump up and pump down signals may be varied to define a phase difference signal. However, varying both the PUn and PDn may require more complex circuitry; therefore, in the most preferred embodiment, the pump up signal is varied, while the pump down signal has a fixed pulsewidth.

Means 28, in the preferred embodiment, will only generate a pump down signal PDn when a corresponding pump up signal PUn has just previously been generated. This ensures that the proper balance of pump up and pump down signals are provided to loop filter circuit 16.

Means 28 operates to generate PDn as follows. Assume that D-type memory element, preferably D-type latch 30 has been reset (either during initial power up or due to the application of an active CK4 clock signal after the most recently generated pump down signal). In such case, the edge signal EDGEn (operating as a "gating" signal to AND gate 34) is a logic zero, thus driving the output of AND gate 34 to a logic low. Whenever a pump up signal PUn is generated, the logic high generated thereby enables latch 30, which causes a logic "1" to flow from the D-input to the Q-output. This logic "1" is applied to AND gate 34, thus enabling it for output. AND gate 34 generates a pulse signal Pn having, in the preferred embodiment, a pulsewidth substantially equal to one-half bit period. Thus, when the pulse signal Pn is generated, AND gate 34, already enabled by the EDGEn signal, simply passes the pulse signal Pn through to generate the fixed pulsewidth pump down signal PDn on an output terminal of gate 34. Subsequent to the generation of the pump down signal PDn, the CK4 clock signal (derived from one of the phases of VCO 18) resets latch 30, causing the EDGEn signal to again become a logic "0", thus disabling AND gate 34 from generating any further pulse down signals PDn (until again enabled by an active EDGEn). Note that means 28 is thus responsive to PUn to generate the PDn signal. In addition, a D-type flip flop 30' (not shown) may be substituted for latch 30 (in an alternate embodiment).

Figures 3, 4:
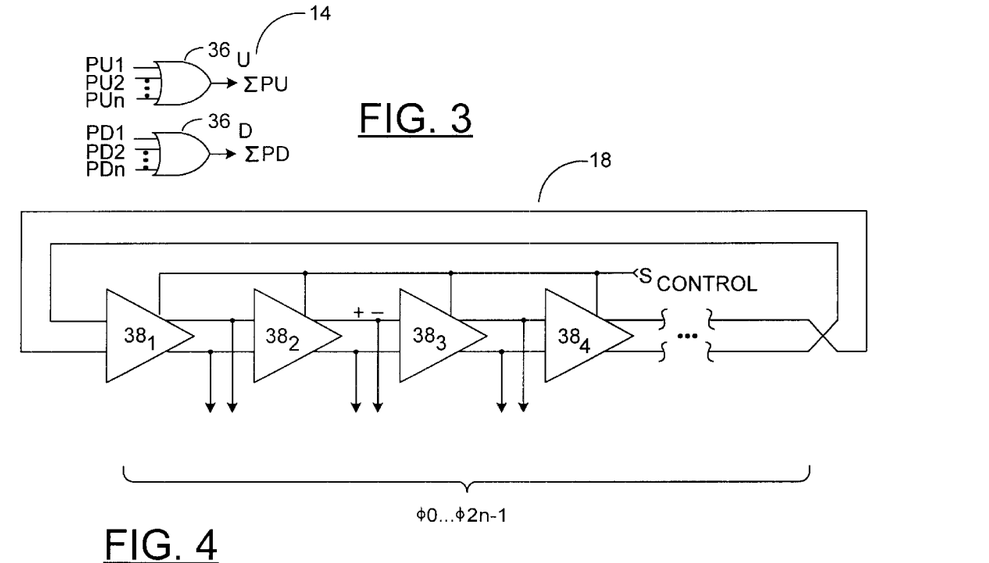
FIG. 3 is a simplified schematic diagram view illustrating one implementation of the summing circuit shown in FIG. 1.
FIG. 4 is a simplified, schematic diagram view of one implementation of the VCO circuit illustrated in FIG. 1.

FIG. 3 shows a digital implementation of summing circuit 14, and which includes a pump up OR gate $36_U$ and a pump down OR gate $36_D$. Since the respective pump up signals and pump down signals generated from each linear phase detector 12, preferably do not overlap (due to the non-overlapping nature of the respective window signals Wn), the relatively simple implementation illustrated in FIG. 3 suffices. Of course, the number of alternate implementations are limited only by the skill of those in the art.

Loop filter circuit 16 is well-known and conventional in the art, and may take any one of a plurality of known forms. Functionally, circuit 16 generates a control signal $S_{control}$ that has a magnitude corresponding to the difference between the pulsewidths of the summed pump up signals ΣPU, and the summed pump down signals ΣPD. For example, U.S. Pat. No. 4,535,459 to Hogge, Jr. discloses a loop filter including long-term integrators substantially performing this function. Of course, there are alternatives that would function equally as well in one or more of the embodiments described herein.

FIG. 4 illustrates one implementation of VCO circuit 18 according to the present invention, and which includes a plurality of differential inverting elements $38_1, 38_2, 38_3, \ldots 38_n$. The differential inverting elements $38_n$ may be connected to form a ring oscillator. Ring oscillators are well known in the art, and any one of the plurality of known conventional ring oscillators may be used in the present invention. For example, U.S. Pat. No. 5,548,251 entitled "High-Frequency Clock Generator Using Lower Frequency Voltage Controlled Ring Oscillator" describes one ring oscillator, and is hereby incorporated herein by reference. The control signal $S_{control}$ is applied to each inverting element for adjusting its switching speed (i.e., input-to-output delay) which in turn changes the operating frequency of the ring. Positive and negative polarity taps associated with each inverting element $38_n$ may be used to derive the various phases φ0, . . . , φ2n−1 used in the present invention, as illustrated in FIG. 4.

Register 20 may be configured to capture the sampled data signals DS1, DS2, . . . , DSn being sequentially generated by phase detectors $12_1, 12_2, \ldots, 12_n$. Register 20 is also configured to output an n-bit parallel data word. In one embodiment, register 20 may comprise n flip flops (falling edge triggered) arranged to receive the sampled data signals, and further to receive an inverted version of the respective window signals associated with a corresponding phase detector. The inversion would provide a small delay so that latch 22 in each detector could stabilize its Q-output (i.e., DSn signal). Since each detector, in-effect, acts as a deserializer, there is no need for a fast shift register—only, for example, a plurality of flip flops defining register 20. It should be appreciated that the register is not required for operation of the invention—a serial output may be appropriate and/or desirable and/or required.

Figure 5:
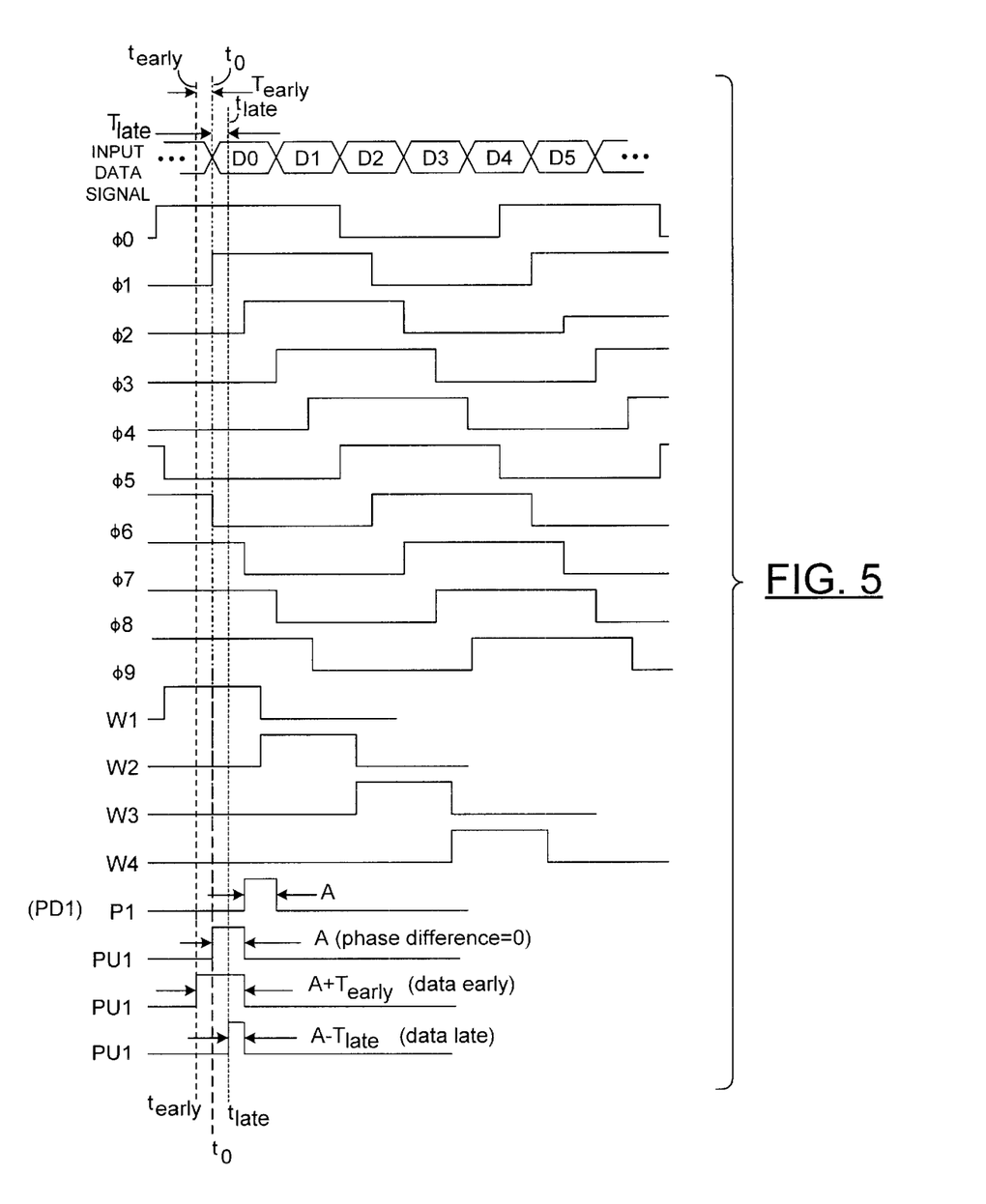
FIG. 5 is a simplified, timing chart diagram view showing various signal waveforms associated with apparatus 10.

Referring now to FIG. 5, an overall description of the operation of a preferred embodiment according to the present invention will now be set forth. The description to appear hereinafter is for an embodiment including five (5) linear phase detectors 12. Since n=5, there are 10 phases or phase signals associated with the output of VCO 18, shown as φ0, φ1 . . . φ9 in FIG. 5. Each phase φn has a frequency equal to: bit rate/5. In addition, FIG. 5 shows the bit periods associated with the input data signal for exemplary data bits D0, D1, D2, D3, D4, and D5.

FIG. 5 also shows the non-overlapping nature, in the active state, of window signals W1, W2, W3, and W4 (window signal W5 for the embodiment where n=5 is not shown for clarity).

When the VCO 18 output phases are substantially phase locked to the input data signal (i.e., the phase difference is substantially zero), then input signal transitions which may occur due to changing data will occur substantially in the exact center of the active part of the window signal Wn. For example, assume that a data transition occurs at a time to for the case where the phase error is substantially zero. This transition substantially coincides with certain edges of pre-selected ones of the output phases of VCO 18. Also, as shown in the trace of window signal W1, time to occurs substantially in the center of the active part of window signal W1. This causes phase detector 12 to generate a pump up signal PUn that has a pulsewidth substantially equal to one-half of a bit period. This is shown in the third trace from the bottom of FIG. 5.

However, assume that the input signal transition occurs, due to data changes, at an earlier time nearly relative to by an amount $T_{early}$. Then the generation of the pump up signal PU will commence earlier, thereby elongating the pulsewidth of the pump up signal. This is shown in the second trace from the bottom of FIG. 5.

Conversely, assume that the input signal transition occurs at a later time relative to by an amount $T_{late}$, namely at time $t_{late}$. Then the generation of the pump up signal will commence at a later time, thereby foreshortening the pulsewidth of the pump up signal PU. This is shown in the bottom trace of FIG. 5.

Accordingly, as shown in the bottom three traces in FIG. 5, the pulsewidth of the pump up signal varies in accordance with a phase difference between the input data signal and the VCO output clock (collectively). The specific circuitry of the illustrated embodiment varies the time when the pulse commences while maintaining fixed the time when the pulse stops; however, this feature is not limiting in nature, by only exemplary.

Since the pump down signal, in the preferred embodiment, is of a fixed pulsewidth, as shown in the fourth trace from the bottom in FIG. 5, the difference in pulsewidth between the pump up signal and pump down signals is proportional to the above-mentioned phase difference. This difference in pulsewidth will cause the magnitude of the control signal $S_{control}$ generated by loop filter 16 to vary. The varying magnitude of the control signal $S_{control}$ varies the output phase and frequency of the various phases of VCO 18.

In addition, in the most preferred embodiment, each of the phase detectors are configured to operate on a corresponding one of a plurality of consecutive bit positions of the input data signals. For example, FIG. 5 shows consecutive bit positions D0–D4, and in the preferred embodiment having 5 phase detectors, each phase detector operates on a respective bit. For example, phase detector $12_1$ operates on D0, detector $12_2$ on D1, detector $12_3$ on D2, detector $12_4$ on D3 and detector $12_5$ on D4. The cycle is started over with the next group of consecutive bits (e.g., detector $12_1$ operates on D5, etc.)

An embodiment according to one aspect of the invention defines a PLL architecture that utilizes a multi-phase output VCO, and a plurality of linear output phase detectors operating in parallel. Each phase detector operates according to its own preselected "window" determined as a function of preselected ones of the VCO phases. Each phase detector generates a phase difference signal, preferably a variable pulsewidth "pump up" pulse, that has a pulsewidth that is proportional to the phase difference between the incoming data, and the VCO output signals. Since the single, high-frequency VCO output clock has been eliminated, lower power consumption is achieved. Moreover, since each of the phase detectors provides a linear phase response, sensitivity to duty cycle distortion and data dependent jitter are substantially minimized.

In an embodiment according to another aspect of the present invention, a linear phase detector is provided that generates a phase difference signal that linearly corresponds to a phase difference between the input signal, and an output signal—namely, the output phases of the VCO). Specifically, a phase detector, according to this aspect of the invention, generates a pump up signal that has a variable pulsewidth, and a pump down signal having a fixed pulsewidth. A D-type memory element is combined with a function gate to generate the pump up signal; however, the D-type memory element, and, optionally, the function gate is controlled (i.e., enabled/disabled) by a window signal. This "windowing" permits it to be employed in a parallel sampling phase detector system, such as in the first aspect of the invention.

While the present invention has been particularly shown and described with reference to the preferred embodiments thereof, it is well understood by those skilled in the art that various changes and modifications can be made in the invention without departing from the spirit and scope thereof, which is limited only by the appended claims. For example, although many of the signals were described as being either active-low or active-high, it should be appreciated that complementary logic relative to that described herein is fully within the spirit and scope of the present invention.

What is claimed is:

1. An apparatus configured to receive an input data signal having a phase and generate an output signal having a plurality of phases comprising:

a plurality of phase detector circuits each configured to receive said input data signal and to generate a respective phase difference signal, each of said respective phase difference signals corresponding to a phase difference between the phase of said input data signal and a respective phase of said output signal, wherein at least one of said phase detectors includes (i) a first memory element configured to generate a sampled data signal in response to said input data signal, (ii) a function gate configured to generate a first pump signal in response to said input data signal and said sampled data signal, and (iii) a second circuit configured to generate a second pump signal in response to said first pump signal; and a circuit configured to generate the respective phases of said output signal in response to said phase difference signals.

2. The apparatus of claim 1, wherein each of said respective phase difference signals is proportional to the phase difference between the phase of said input data signal and the respective phase of said output signal.

3. The apparatus of claim 1, wherein each of said phase detector circuits includes a logic circuit configured to generate a window signal in response to a plurality of clock signals.

4. The apparatus of claim 1, wherein each phase detector circuit includes a respective logic circuit for generating a plurality of window signals, said window signals each having a respective active state and a respective inactive state wherein said window signals are non-overlapping in said active state.

5. The apparatus of claim 1, wherein at least one of said phase difference signals has a variable pulsewidth.

6. The apparatus of claim 3, wherein said first memory element is configured to generate said sampled data signal when said window signal is active.

7. The apparatus of claim 1, wherein each phase detector circuit is configured to generate a respective sampled data signal, said apparatus further including a register for storing an n-bit data word in response to said sampled data signals.

8. The apparatus of claim 1 wherein said circuit includes a loop filter configured to generate a control signal varying in magnitude as a function of said phase difference signals.

9. The apparatus of claim 1 wherein said circuit includes a voltage-controlled oscillator (VCO) configured to generate said plurality of phases of said output signal.

10. The apparatus of claim 9 wherein said VCO comprises a ring oscillator having a plurality of stages.

11. A parallel sampling phase detector apparatus comprising;
   a plurality of phase detector circuits each configured to receive an input data signal, said phase detector circuits being configured to generate a phase difference signal, each of said phase difference signals corresponding to a phase difference between the phase of said input data signal and a respective phase of an output signal, wherein at least one of said phase detectors includes (i) a first memory element configured to generate a sampled data signal in response to said input data signal, (ii) a function gate configured to generate a pump signal in response to said input data signal and said sampled data signal, and (iii) a second circuit configured to generate a second pump signal in response to said first pump signal;
   a loop filter configured to generate a control signal in response to said phase difference signals; and
   a voltage controlled oscillator (VCO) configured to generate said output signal in response to said control signal wherein said output signal has a plurality of phases, wherein each phase detector circuit operates according to at least one preselected phase of said VCO output signal.

12. The phase detector apparatus of claim 11 wherein at least one of said phase detector circuits includes a logic circuit configured to generate a window signal in response to preselected ones of said plurality of phases of said VCO output signal.

13. The phase detector apparatus of claim 11, wherein each phase detector circuit includes a respective logic circuit for generating a plurality of window signals, said window signals each having a respective active state and a respective inactive state wherein said window signals are non-overlapping in said active state.

14. A method of recovering data from an input data signal comprising the steps of:
   (A) generating, for each one of a plurality of linear output phase detectors, (a) a respective phase difference signal in response to said input data signal, wherein each phase difference signal corresponds to a respective phase difference between the phase of said input data signal and a respective phase of an output signal and at least one of said phase detectors includes (i) a first memory element configured to generate a sampled data signal in response to said input data signal and (ii) a function gate configured to generate a first pump signal in response to said input data signal and said sampled data signal and (b) a second pump signal;
   (B) generating the respective phases of said output signal in response to the phase difference signals; and
   (C) determining and storing a plurality of bit values during respective bit periods of said input data signal in response to said phases of said output signal.

15. The method of claim 14 further including the step of;
   storing said bit values to thereby form a parallel-bit data word.

16. The method of claim 14 wherein step (C) includes the substeps of:
   generating a window signal for each linear phase detector in response to preselected phases of said output signal, only one of said window signals being active at a time; and
   generating, for each linear phase detector, the sampled data signal when a respective one of said window signals becomes active.

17. The apparatus according to claim 3, wherein said function gate comprises an enable terminal for receiving said window signal.

18. The apparatus according to claim 12, wherein said function gate comprises an enable terminal for receiving said window signal.

19. The method according to claim 16, wherein said function gate comprises an enable terminal for receiving said window signal.

20. The apparatus according to claim 1, wherein (i) said second circuit comprises a second memory circuit, (ii) said first pump signal comprises a pump up signal and said second pump signal comprises a pump down signal, and (iii) said phase difference signal comprises said first and second pump signals.

21. The method according to claim 14, wherein (i) said first pump signal comprises a pump up signal and said second pump signal comprises a pump down signal, (ii) at least one of said first and second pump signals have a pulsewidth that varies according to a respective one of said phase differences, and (iii) said phase difference signals comprise said first and second pump signals.

22. The apparatus according to claim 7, wherein n equals the number of said plurality of phase detector circuits.

* * * * *